(12) United States Patent
Wenham et al.

(10) Patent No.: US 8,398,877 B2
(45) Date of Patent: Mar. 19, 2013

(54) METHOD OF FORMING OPENINGS IN SELECTED MATERIAL

(75) Inventors: Stuart Ross Wenham, Kyle Bay (AU); Alison Lennon, Rozelle (AU); Roland Yudadibrata Utama, Singapore (SG); Anita Wing Yi Ho-Baillie, Lane Cove (AU)

(73) Assignee: Newsouth Innovations Pty Ltd., Sydney (AU)

( * ) Notice: Subject to any disclaimer, the term of this patent is extended or adjusted under 35 U.S.C. 154(b) by 754 days.

(21) Appl. No.: 12/533,449

(22) Filed: Jul. 31, 2009

(65) Prior Publication Data

US 2010/0047721 A1      Feb. 25, 2010

Related U.S. Application Data

(63) Continuation-in-part of application No. PCT/AU2008/000023, filed on Jan. 10, 2008.

(30) Foreign Application Priority Data

Jan. 31, 2007   (AU) ................................ 2007900451
Aug. 31, 2007   (AU) ................................ 2007904726

(51) Int. Cl.
   *B44C 1/22*       (2006.01)
   *B29D 11/00*      (2006.01)
(52) U.S. Cl. .................. 216/83; 216/2; 216/17; 216/24; 216/87; 438/749; 438/750

(58) Field of Classification Search ................ 216/2, 17, 216/83, 87, 24; 438/749, 750
   See application file for complete search history.

(56) References Cited

U.S. PATENT DOCUMENTS

| | | | |
|---|---|---|---|
| 5,049,230 A * | 9/1991 | Patel et al. | 216/87 |
| 6,486,058 B1 | 11/2002 | Chun | |
| 2005/0191847 A1 | 9/2005 | Misa Wa et al. | |
| 2005/0260856 A1 | 11/2005 | Kim et al. | |
| 2006/0292821 A1* | 12/2006 | Young | 438/427 |

* cited by examiner

*Primary Examiner* — Shamim Ahmed
(74) *Attorney, Agent, or Firm* — Vedder Price P.C.; Thomas J. Kowalski; Deborah L. Lu

(57) ABSTRACT

A method is provided for forming an opening in a layer of a selected material. The method comprises, forming a polymer resist layer over said selected material and plasticising areas of the resist where openings are to be formed. The plasticising is performed by depositing a first solution onto the surface of said polymer resist layer, where the first solution is a plasticiser selected to increase permeability of the polymer resist layer to a second solution, in an area which has absorbed the first solution. The second solution is selected to be an etchant or solvent for the selected material. After the resist layer has been selectively plasticised, it is contacted with the second solution, which permeates the polymer resist layer in the area of increased permeability and forms an opening in the selected material.

20 Claims, 11 Drawing Sheets

Illumination

US 8,398,877 B2

METHOD OF FORMING OPENINGS IN SELECTED MATERIAL

INCORPORATION BY REFERENCE

This application is a continuation-in-part of International application No. PCT/AU2008/000023, filed Jan. 10, 2008, designating the U.S., and claiming priority to Australian application No. 2007900451, filed Jan. 31, 2007 and Australian application No. 2007904726, filed Jan. 31, 2007.

Any foregoing applications, and all documents cited therein or during their prosecution ("application cited documents") and all documents cited or referenced in the application cited documents, and all documents cited or referenced herein ("herein cited documents"), and all documents cited or referenced in herein cited documents, together with any manufacturer's instructions, descriptions, product specifications, and product sheets for any products mentioned herein or in any document incorporated by reference herein, are hereby incorporated herein by reference, and may be employed in the practice of the invention.

COPYRIGHT NOTICE

A portion of the disclosure of this patent document contains material that is subject to copyright protection. The copyright owner has no objection to the facsimile reproduction by anyone of the patent document or the patent disclosure, as it appears in the Patent and Trademark Office patent files or records, but otherwise reserves all copyright rights whatsoever.

FIELD OF THE INVENTION

The present invention relates generally to the field of device fabrication and, in particular, to the patterned deposition of liquids onto a resist layer to form openings in underlying structures of devices, such as solar cell devices.

BACKGROUND OF THE INVENTION

In order to make solar power a viable alternative to established generating methods such as fossil fuel and nuclear power, it is necessary to bring the manufacturing cost of solar cells down. This has been achieved to some extent in thin film devices by use of large area devices carrying small quantities of silicon. However, the efficiencies obtained for such devices are significantly lower than those obtained for silicon-wafer-based solar cell devices. In addition, the manufacturing processes currently formulated for thin film devices are still complex and require significant improvement for cost-efficient production on larger scales.

Consequently, most solar cell devices currently commercially produced are based on silicon wafer technology which has been refined to achieve commercial efficiencies in the order of 16-18%. In general, this technology involves appropriately doping the wafers to form the required p-n junctions for carrier collection. Typically, the surfaces of the wafer are passivated by dielectric layers, composed of either silicon dioxide or silicon nitride. Metal contacts can then be made to the p-type and n-type silicon in a number of different ways. Higher efficiencies have been achieved for silicon wafer solar cells where semiconductor device fabrication methods, such as photolithography, have been used to create patterned buried metal contacts in either one or both of the surfaces of the doped/passivated silicon wafer. For example, efficiencies of 24.5% and 24.7% were recorded at the University of NSW, Australia in 1999 using magnetic Czochralski (MCZ) and float-zone (FZ) silicon wafers, respectively. Both these results were obtained using photolithography and semiconductor device fabrication methods.

However, semiconductor device fabrication methods require costly equipment (e.g., lasers, mask aligners), expensive clean room environments, and generally many time-consuming steps. For example, photolithographic patterning of a dielectric layer requires deposition of a resist layer over the dielectric layer (usually by spin-coating), patterning of the resist using a prepared mask which is appropriately aligned, exposing the resist through the mask and then developing the exposed resist to form a pattern in the resist. This pattern can then be used to etch the underlying dielectric layer in the desired manner. Finally the resist layer is then removed to leave a patterned dielectric layer.

A further disadvantage of current photolithographic patterning methods is that if a number of different metal contact patterns are required, then the entire photolithographic process must typically be repeated for each pattern. For example, if it is necessary to create metal contacts to both n-type and p-type silicon, then different etching processes would be required for each contact pattern. If n-type silicon is located immediately under the dielectric, then contact to n-type can be made through holes or grooves etched in dielectric layer. Etching of dielectrics, such as silicon oxide, can be achieved using dilute hydrofluoric acid. However, making metal contact to p-type silicon from the same surface requires etching of both the dielectric layer and the n-type silicon layer located directly under the dielectric layer. Etching of silicon cannot be achieved using dilute hydrofluoric acid and therefore a different etchant must be used to etch the silicon required for the p-type contacts (e.g., "purple" etch as disclosed in WO 2005/024927). Consequently, it is difficult to use a single photolithographic process to create holes or grooves for both sets of contacts.

SUMMARY OF THE INVENTION

According to a first broad aspect a method of forming an opening in a layer of a selected material is provided, the method comprising:
  (a) forming a polymer resist layer over said selected material;
  (b) depositing a first solution onto the surface of said polymer resist layer at a first set of one or more target locations, said first solution selected to increase permeability of the polymer resist layer to a second solution, in an area which has had the first solution applied, and the second solution being an etchant or solvent for the selected material;
  (c) contacting said polymer resist layer with said second solution, whereby the second solution permeates the polymer resist layer in the area of increased permeability and forms an opening in the selected material beneath the area of increased permeability.

The selected material will preferably comprise a surface layer of a semiconductor structure such as the precursor for a solar cell. The method is particularly useful for the formation of openings in a dielectric layer of the structure, in which case the dielectric layer may comprise one of silicon dioxide, silicon nitride, silicon carbide, titanium dioxide, zinc sulphide, magnesium fluoride or an insulating polymer insulating material, or a mixture or layered structure of several of these materials. Preferably the formed opening does not penetrate the material under the dielectric layer, however if there is a requirement to form an opening in an underlying layer this may be achieved after the openings are formed in the selected layer, by a separate etch. When the layer of selected material is dielectric material compound of a semiconductor material, the layer underlying the layer of selected material may be a layer of the corresponding semiconductor material and may, for example, be a silicon component of the said semiconductor structure such as a solar cell (or its precursor).

In one embodiment of the method, after the openings are formed, the change in permeability in the polymer resist layer may be reversed. This may be achieved, for example, by heating the polymer resist layer. The change in permeability in the polymer resist layer may also be reversed by reflowing the resist or depositing further resist material over a polymer resist region having increased permeability.

When reversing the permeability of the resist in an area, the reversal need not be complete. Controlling the reversal process, to achieve a partial reversal of the permeability, provides an excellent method of reducing the area made permeable and hence reducing the hole size made in the underlying selected material when etching through the permeable area.

A number of reversal methods can result in partial reversal (i.e. a reduction in the permeable areas) which in turn allows the etching of smaller holes. Some examples are:

a) applying carefully measured amounts of resist over the plasticised areas such that the plasticiser diffuses from the plasticised area into the newly deposited resist and causes reduced permeability particularly around the edges of the plasticised region;

b) applying a solvent for the resist which softens and reflows the resist in the plasticised regions increasing the mobility of the plasticiser and allowing diffusion of the plasticiser over a larger area resulting in a reduction of permeability particularly at the edges of the original plasticised areas c) heating the resist to cause softening of the resist which increases the mobility of the plasticiser in the plasticised regions and causes diffusion of the plasticiser over a larger area resulting in a reduction of permeability particularly at the edges of the original plasticised areas d) using a relatively volatile plasticiser to cause the permeable regions in the first place and heating the plasticised regions to drive out some of the plasticiser resulting in a reduction of permeability particularly at the edges of the original plasticised areas.

Selective heating of the plasticised regions may be achieved using a laser, which may be slightly defocused if necessary to allow less aggressive heating over a larger area.

When softening the resist by application of a solvent for the resist, the time for which the resist is exposed to the solvent can be controlled to ensure only partial and not complete reversal of the resist's permeability. The solvent can be applied by exposing the resist to a saturated vapour of the solvent.

When applying resist to the surface to be etched, the thickness of the resist may be varied so that the thinner regions will become permeable to the etching solution prior to the thicker regions after application of a given amount of the plasticiser solution. This will also provide additional ways of making the feature sizes (permeable areas) smaller than can be achieved by using the standard droplet size. Because the plasticised region diminishes in area with depth in the resin (polymer resist) layer the thicker the resin layer the smaller the area of the plasticised region will be at the surface of the selected material to be etched.

There is a range of ways in which the thickness in the resist layer can be varied. For example, when the resin layers are deposited on textured surfaces, thinner regions are formed near the peaks of the pyramids or grooves where the <111> planes intersect. Alternatively, the resin can be deposited with non uniform thickness by various techniques including the use of inkjet printing or screen-printing of the resin material.

Subsequent deposition of the first solution in target locations can therefore produce permeable regions of reduced area compared to the droplet size by virtue of the fact that some of the area under each droplet has resist that is thicker.

The polymer resin may be, for example novolac resin, in which case the first solution which effects a change in permeability may be diethylene glycol and the change in permeability in the novolac layer may be reversed by heating the polymer resist layer to a temperature of at least 190° C. for at least 30 mins.

The first solution is preferably a plasticiser for the material used to form the polymer resist layer, and may for example be one of diethylene glycol, triethylene glycol, or a propylene glycol. The second solution is preferably an etchant for the selected material and for the case where the selected material is silicon oxide material the etchant may be, for example, buffered hydrogen fluoride. When a second etch is performed on a material layer the layer of selected material, the underlying layer may be silicon in which case a silicon etchant such as HNA (consisting of hydrofluoric acid, nitric acid and water/acetic acid) may be used.

The deposition of the first solution to selectively increase permeability may be achieved by applying one or more droplets of said first solution from a drop-on-demand device. The drop-on-demand device may be printer type device such as a piezoelectric inkjet device or a thermal inkjet device.

The openings formed in the selected material will generally be substantially circular holes however other shapes are possible and may be created by building a pattern of circular shapes. For example, by connecting a series of overlapping circular shapes a permeable region may be formed in the polymer resist layer which allows the etching of an opening forming a groove when the second solution is applied.

Two sets of openings may be formed in the layer of selected material by:

(a) selectively depositing a third solution at a second set of one or more target locations, said third solution selected to increase permeability of the polymer resist layer to a fourth solution, in an area which has had the third solution applied, and the fourth solution being an etchant or solvent for the selected material;

(c) contacting said polymer resist layer with the fourth solution, whereby the said fourth solution permeates the polymer resist layer in the area of increased permeability of the fourth solution and forms openings in the selected material beneath the area of increased permeability of the fourth solution.

When two sets of openings are formed in the selected material, a further etching step may be performed in the first openings before the second openings are etched. This might be done if for example one set of openings are required to extend into an underlying layer. Also, before applying the third solution the permeability of the polymer resist layer at said first set of target locations may be reversed to avoid these locations being further etched or otherwise affected.

The second and fourth solutions may also be applied in a single process, such as when a plurality of print heads is used to apply different solutions simultaneously, or where the same solution is used as the first and third solutions.

Often, the polymer resist layer may be removed from the device after the first and second set of openings have been formed, before further processing. When the above process is used to make openings in a dielectric layer through which a metal contact will be formed metal is deposited into the first openings to form a first type of contact of a solar cell device and further metal is deposited into the second openings to form a second type of contact of a solar cell device. The two metalisations may be applied simultaneously and the contacts separated later, for example by scribing.

BRIEF DESCRIPTION OF THE DRAWINGS

Embodiments of the invention will now be described, by way of example, with reference to the accompanying drawings in which.

DETAILED DESCRIPTION

Figure 1A:
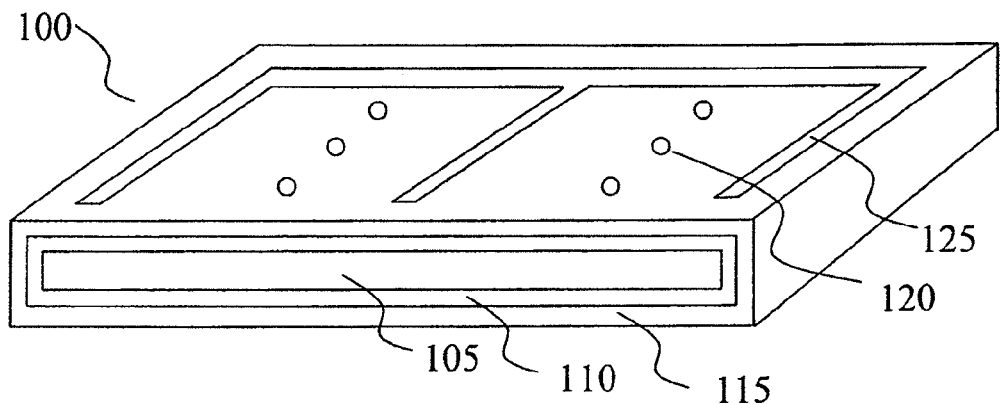
FIG. 1A is a schematic diagram showing an arrangement of a preferred solar cell device the manufacture of which may use the method described herein.

The following description is given by way of illustration only and shall not be taken as being in any way limiting as to the spirit or scope of the invention. Referring to the drawings, like numerals designate corresponding parts where possible throughout the several figures.

A method for forming openings, such as circular holes and continuous grooves, in structures or layers of devices is described below. The openings, once formed, can be used to facilitate metal contacting for the device. The described methods are preferably used in the fabrication of semiconductor devices, such as solar cell devices. However they can also be advantageously utilised in the fabrication of micro-electro-mechanical systems (MEMS) devices. The method of forming the openings requires the use of a resist (or resin) layer which is formed over the device substrate. The resist layer is then patterned by the selective deposition of small liquid drops onto the resist surface. The deposited liquid modifies the properties of the regions of resist in which it is in contact, such that those regions become permeable to aqueous etchants which can act on underlying structures or layers of the device.

Various aspects of the present method will now be described with reference to the fabrication of a silicon-wafer-based solar cell device with interdigitated rear-side contacts.

FIG. 1A depicts a solar cell device 10 comprising a p-type silicon wafer 105, in which the surface has been diffused with dopants such as phosphorus to create an n-type surface layer 110. The thickness of the substrate is about 250 μm. Preferably, a thin layer of dielectric material 115 such as thermally grown silicon dioxide of around 360 nm thickness is formed over the n-type surface layer 110. Similarly, an n-type silicon wafer substrate may also be used in conjunction with a p-type surface layer, which is diffused with opposite polarity dopants such as boron. Other substrates such as glass or plastic material may also be used with silicon being deposited using processes such as plasma enhanced chemical vapour deposition (PECVD). Such structures can result in thin film solar cell devices.

Examples of suitable dielectric materials that may be used include silicon oxides, silicon nitride, titanium dioxide, zinc sulphide, magnesium fluoride or a range of other polymers. Dielectric layers can be deposited using processes such as PECVD and thermal evaporation or they may be thermally grown in a high temperature furnace.

In the preferred arrangement, both the n-type and p-type metal contacts of a solar cell device are formed on the rear side of the device. Advantages of having both polarities contacts on the rear side of the device include:

(i) Zero shading in the front illuminated surface which increases device current;

(ii) Thinner device design which cuts material cost; and (iii) Simpler cell interconnection costs which lower overall cost in module production.

In FIG. 1A, the n-type metal contacts 120 are depicted as individual holes spaced from each other whereas the p-type metal contacts 125 are depicted as a series of continuous and interconnected grooves which are spaced from the n-type metal contact holes 120 to provide electrical isolation between the two metal contacts.

Figure 1B:
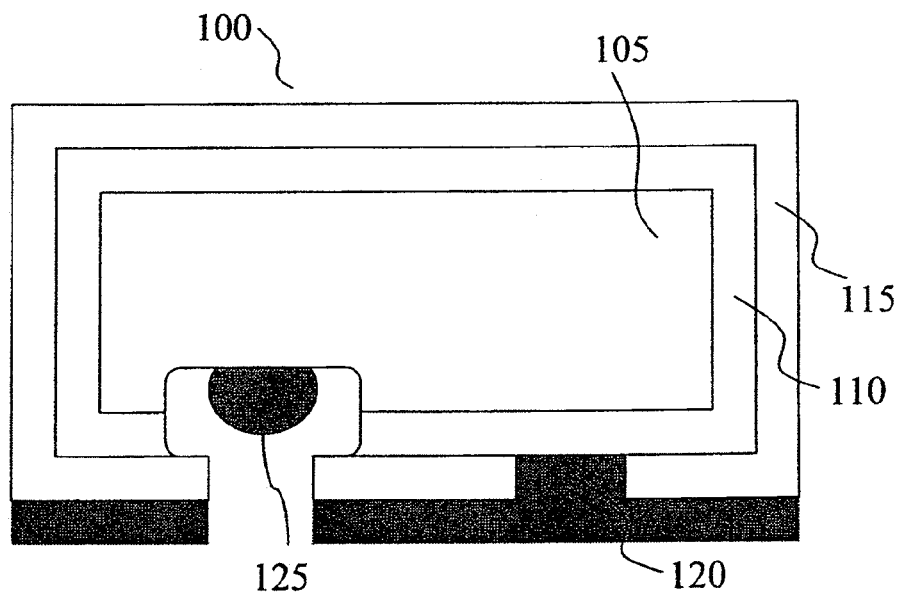
FIG. 1B is a schematic diagram showing in cross-section an arrangement of a solar cell device the manufacture of which may use the method described herein.

FIG. 1B schematically depicts a simplified cross section view of the solar cell device 10 of FIG. 1A. The n-type metal contact 120 is formed by opening a defined area of the dielectric material to expose the n-type surface layer underneath the dielectric material whereby a suitable metal such as silver or aluminium can be deposited by suitable method such as thermal evaporation or sputtering. The p-type metal contact 125 is also formed by opening a defined section of the dielectric material, in a different and isolated location from that occupied by the n-type metal contact, and by etching the exposed n-type surface layer using an appropriate etchant such as HNA etch (consisting of hydrofluoric acid, nitric acid and water/acetic acid), diluted potassium hydroxide, diluted sodium hydroxide or by some other method of etching including wet, dry or mechanical etching techniques to form grooves which expose the buried p-type layer. A suitable metal such as aluminium or magnesium may then be deposited by suitable method such as thermal evaporation or sputtering such that the metal only comes in contact with the p-type layer and is electrically isolated from the n-type layer and/or n-type metal contact.

Localized openings required for the fabrication of the solar cell device 10, such as those utilized to form the n-type metal contacts 120 and p-type metal contacts 125, can be formed using lithographic processes such as conventional photolithography. However, photolithographic processes are often relatively complex and time consuming and are costly to implement. Hence, photolithographic processes are not ideally suited to the fabrication of large-area, high-efficiency solar cell device structures. In general, the fabrication of semiconductor devices typically uses photolithographic techniques extensively.

The present method can be used to create openings in semiconductor devices, such as the solar cell device 10 schematically depicted in FIG. 1A and FIG. 1B. The method involves patterning a resist layer formed over the device and then immersing the device in an aqueous etching solution to form the openings to the underlying n-type and p-type material in the device according to the patterned resist. The patterning of the resist is achieved by selective deposition of small quantities of liquid onto the resist surface. In the regions in which the deposited liquid contacts the resist, it causes the resist to become permeable to aqueous etchants which can then locally pass through the resist to act on underlying layers of the semiconductor device. Preferably, the resist is patterned using drop-on-demand printing techniques, such as inkjet printing.

The method of forming openings in a device such as the solar cell device 10 depicted in FIG. 1A and FIG. 1B will now be described in detail with reference to FIG. 2A to FIG. 2I.

The material used for the resist layer can be a material used as a photolithography resist, such as a novolac resin, polymethylmethacrylate (PMMA), or some other polymer that can protect the underlying dielectric layer from the action of subsequently applied etchants (e.g., polyvinyl alcohol, polyvinyl phenyl). The novolac resin used in the preferred arrangement is similar to that used in many photoresist solutions but without the photoactive compounds. Elimination of the requirement to use resists with photoactive compounds is a significant advantage of the current method compared to the photolithographic process.

Figure 2A:
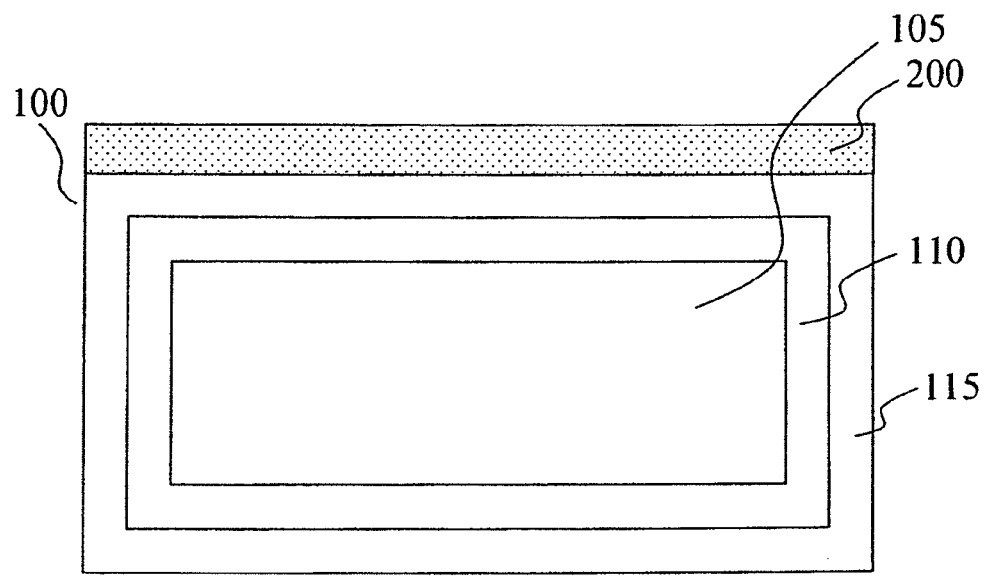
FIG. 2A is a schematic diagram showing a cross-section of a substrate that is coated on one surface with a layer of resist.

In the preferred arrangement, the starting point is a substrate 100 comprising a dielectric coated wafer. A layer of novolac resin (Microposit FSC-M Surface Coating supplied by Rohm & Haas) is applied to the surface of the substrate 100 by spin-coating, and the coated device is then baked in a convection oven, hot plate or by some other method, at 140° C. for 10 minutes to evaporate off most of the solvent [propylene glycol monomethyl ether acetate (PGMEA) in the case of the Microposit FSC-M resin used] in order to create a firm resist layer 200 as shown in FIG. 2A. This process results in a resist layer of approximately 2.5 microns thickness if 0.1 mL of the resin solution is spin coated at 4000 rpm for 30 seconds.

Other spinning speeds and durations result in different thicknesses of the resist layer. For the particular resist used in the preferred arrangement, the thickness of the resist layer can be varied between 2 to 4.6 microns by using different spinning speeds. Different resist thickness can also be achieved by diluting the resist solution with its respective solvent or by using multiple spinning sequences. Other baking temperatures and baking durations may also be used as long as the process can evaporate enough of the solvent to create a firm resist layer that can protect underlying device structures from the action of etchants. Alternative methods of applying the resist layer include spray coating or inkjet deposition.

In the preferred arrangement, the resist layer 200 is sacrificial, being removed after the necessary openings have been formed. In alternative arrangements, the resist layer 200 can become part of the final device. For example, in a rear-contacted solar cell device such as the device 10 of FIGS. 1 & 2, particles of white pigment (e.g., titanium dioxide) can be added to the resist material enabling the resist layer 200 to be used (on the rear surface) to trap light inside the cell for maximum absorption.

The permeability of the resist layer 200 can be increased by the programmed deposition of droplets of a chemical which acts as a plasticiser for the resist material. Plasticisers are small, non-volatile molecules that can push their way between the polymer (resin) chains, setting the chains apart from one another and thus allowing the polymer to become more mobile and elastic. Plasticisers are commonly added to polymers to prevent them from becoming too brittle and fragile. They differ from solvents, in that their thermodynamic solubility is much less than a solvent. Preferably the plasticiser is deposited in liquid form.

Figure 2B:
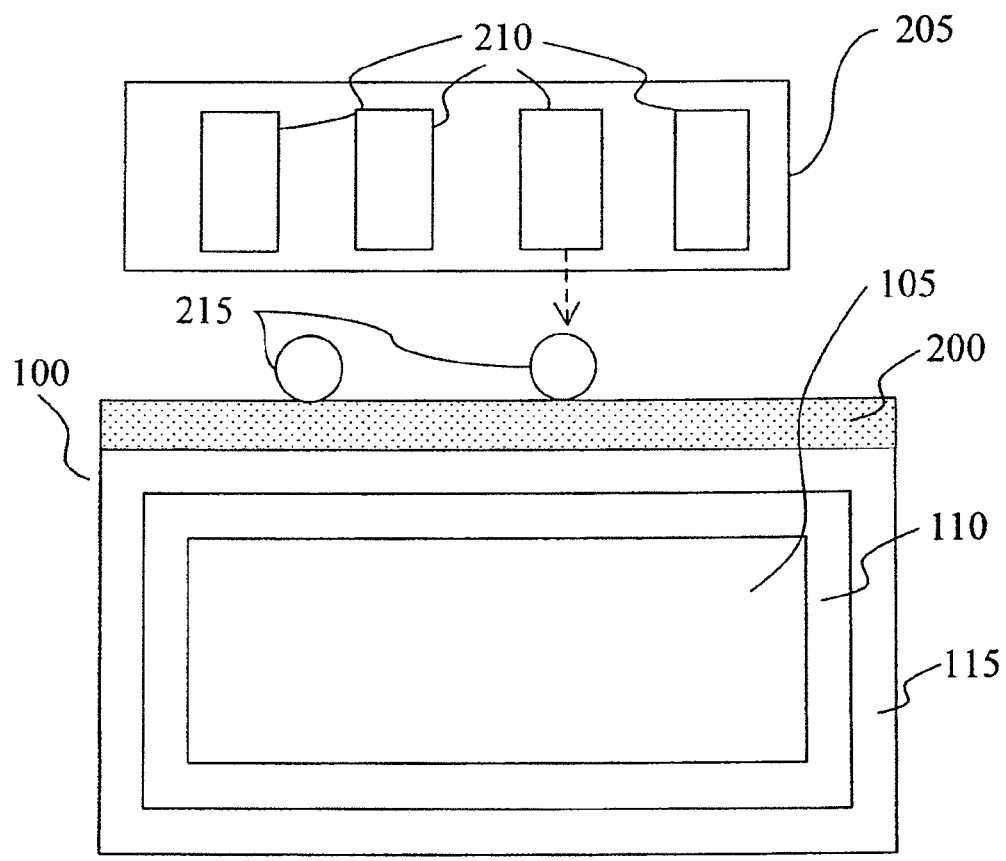
FIG. 2B is a schematic diagram showing the deposition of two drops of plasticiser onto the resist layer of the resist coated substrate of FIG. 2A.

FIG. 2B shows two droplets of plasticiser 215 being deposited on the resist layer 200 which coats the dielectric layer 115 of the substrate 100. In the preferred arrangement, a solution of diethylene glycol (DEG) is deposited as the plasticiser. Glycols, such as DEG, triethylene glycol and a range of propylene glycols are commonly-used plasticisers for the novolac resin used in the preferred arrangement. The plasticiser can be deposited as a solution with a solvent such as water, PGMEA, acetone or isopropyl alcohol. Appropriate plasticisers need to be selected for particular polymers. Other commonly-used industrial plasticisers that are more generally used include glycerol and glycerol derivatives such as glycerol triacetate, glycol ethers, and sugar alcohols such as sorbitol.

Preferably, droplets of DEG (e.g., 215) are deposited onto the resist layer 200 by means of a drop-on-demand inkjet device 205 as shown in FIG. 2B. Typically, an inkjet device such as 205 has a number of print heads 210, from which solutions can be ejected via a small diameter orifice. In the preferred arrangement, the DEG solution is heated to 45° C. in order to bring its viscosity and surface tension closer to the ideal range of jettable liquids for the particular inkjet head used (i.e., between 10 and 14 cP for viscosity and between 28 and 32 mN/m for surface tension). Other methods of accurately depositing material onto a substrate may also be used.

In the preferred arrangement, the DEG is deposited by a SX3 piezoelectric inkjet print head manufactured by Dimatix Inc. This inkjet head has a single line of 128 addressable nozzles with each nozzle having a diameter of 19 microns capable of depositing 8 pL droplets. The nozzles are spaced 508 microns from each other. Since the inkjet print head used in the preferred arrangement is a piezoelectric inkjet print head, the jetting voltage which determines the degree of dislocation of the piezoelectric plate which expels the fluid out of the orifice affects the drop size of the deposited fluid. In the preferred arrangement, the DEG is jetted at jetting voltage of 50 V.

Since DEG is not corrosive and is compatible with an extensive range of materials, other inkjet print head technologies can also be used. Current thermal inkjet devices can generate droplet sizes in the order of 1 pL which is much smaller than used by the inkjet device of the preferred arrangement. In addition, thermal print heads are typically less costly and thus more readily replaced in the event of nozzle firing failures. Other drop-on-demand methods can also be used. Therefore, a potentially advantageous feature of the present method is the ability to use a range of inkjet print heads. This means that a particular application of the method can adopt an inkjet deposition method the features of which are best suited to the application.

In the preferred arrangement, the substrate 100 with the resist layer 200 (as shown in FIG. 2A) is placed on top of a platen and constrained there by means of vacuum suction. The platen is then controlled by a motion precision system (manufactured by iTi Corp.) with a positional accuracy of 1 to 2 μm in x and y directions. The motion precision system is equipped with a sufficient encoder which allows printing at resolutions higher than the native resolution of the inkjet head in both x and y directions. The deposition of the material onto the resist coating of the substrate 100 is initiated by bringing the platen under the fixed mounted inkjet print head and then executing the required number of swathes in order to create the pre-determined pattern, defined by an image, on the substrate. This printing process results in a plurality of droplets being deposited onto the resist-coating on the substrate 100 according to the predetermined pattern.

In the preferred arrangement, the substrate is placed a distance of about 1 mm below the inkjet head. Other inkjet head and substrate separation may also be utilized although further separation generally results in some deflection in the flight paths of droplets which causes non-uniformity and reduced droplet precision. Preferably, after the resist is added, the substrate 100 is heated to 70° C., or at least 60° C., during deposition. Substrate heating facilitates quick evaporation of the deposited fluid on contact with the substrate and assists diffusion of the deposited fluid molecules into the resist layer 200.

Figure 2C:
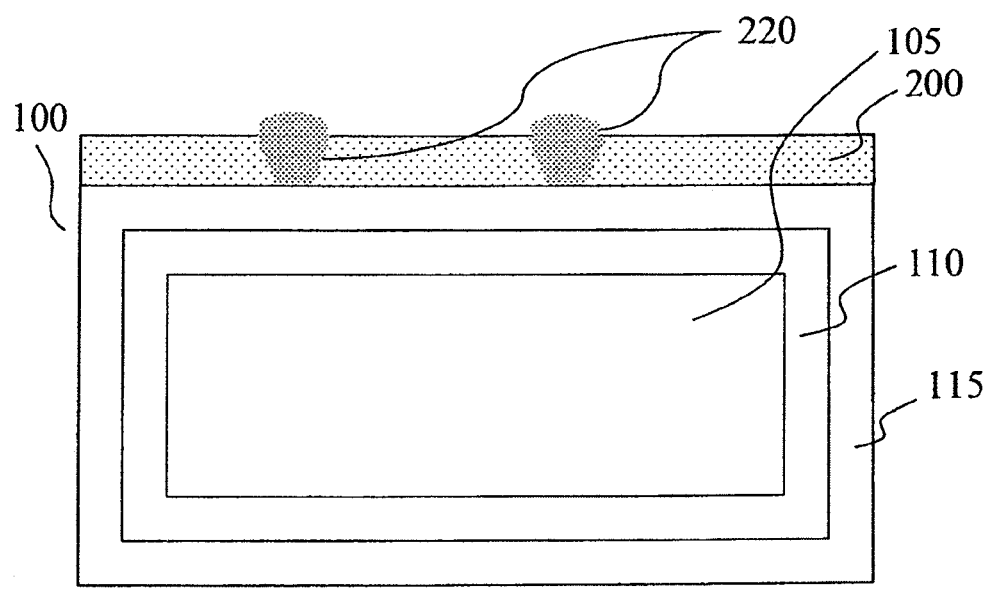
FIG. 2C is a schematic diagram showing the formation of plasticised regions in the resist layer corresponding to the positions where the plasticiser was deposited in FIG. 2B.

Deposited droplets of DEG (e.g., 215) create localized permeable regions 220 within the resist layer 200 where they make contact with the resist layer 200 as shown in FIG. 2C. The DEG molecules enter and become distributed in the resist, spreading the polymer chains to make the resist more plastic. Due to the added volume, the resist material swells resulting in a raised region of resist in the vicinity of the drop as shown in the AFM cross-section image in FIG. 3A and the AFM surface profile image in FIG. 3B. These images were obtained after an 8 pL droplet of DEG was deposited on the resist surface. The plasticised resist region 220 swells above the surface of the resist to a maximum height of approximately 0.5 μm at the perimeter of the plasticised region and 0.3 μm in the centre of the region.

The profile of the resist layer 200 after a droplet of plasticiser is deposited is markedly different from that when a droplet of solvent (e.g., acetone) is deposited on a resist layer. In the latter case, a hole or opening forms in the resist layer 200. In the current method, the deposited material does not remove or redistribute any resist material from the regions where the plasticiser solution is deposited.

The size of the plasticised resist region 220 in FIG. 2C is substantially determined by the size of the deposited droplet 215 and the wetting characteristics of the plasticiser solution on the resist layer 200. Larger contact angles, and hence smaller plasticised regions, can be obtained if the critical surface tension of the resist layer 200 is lowered. This can be achieved by selecting a resist material having a lower critical surface tension or coating the resist layer with a hydrophobic agent such as polydimethylsiloxane (PDMS), hexamethyldisilazane (HMDS) or a range of other silicones or polymers. Alternatively, compounds can be added to the resist solution to reduce its critical surface tension. For example, addition of small quantities of surfactants (e.g., 1 to 5%), such as Triton X100, to the resist solution reduces the resist layer critical surface tension resulting in smaller plasticised resist regions. Also, rather than decreasing the critical surface tension of the surface, it is possible to add compounds to the plasticiser solution to increase the viscosity and/or surface tension of the droplet.

On swelling, the resist material becomes more permeable to aqueous solutions, in particular aqueous solutions that can act as etching solutions (etchants) for the underlying layer. This means that, once permeable regions 220 have been created in the resist layer 200, the substrate 100 can be immersed in a tank of appropriate etching fluid to create openings in the underlying dielectric and/or silicon layers. In the preferred arrangement, the first set of plasticised regions (e.g., 220) is used to create openings in the dielectric layer 115 which can be used to form the n-type contacts 120. In alternative arrangements, openings which extend to contact the p-type silicon of the device 100 could be formed using the first set of permeable regions. The method of etching a dielectric region under a plasticised region, such as 220, will be described with reference to FIG. 2D.

Preferably, the substrate 100 is first immersed in a tank of deionised water for at least 4 minutes to ensure a suitably aqueous environment in the plasticised permeable regions 220 followed by immersion in a tank of buffered oxide etch (BOE) (consisting of hydrofluoric acid, ammonium fluoride and water) for 8 minutes and then rinsed in a tank of deionised water for about 10 minutes to remove all traces of the BOE from the device. The initial immersion step in deionised water may be omitted if the deposited plasticiser solution is diluted sufficiently with water such that it creates a sufficiently aqueous environment for the etchant to permeate through the plasticised regions. The etchant immersion time depends on the thickness of the dielectric layer and the etch rate of the etchant on the particular underlying dielectric layer used. Buffered oxide etch is used in the preferred arrangement because the ammonium fluoride raises the pH level of the etching solution thereby reducing the attack rate of the etching solution on the novolac resin resist layer used. Note that other etchants may also be used to etch the underlying dielectric layer.

Preferably, the etching process does not attack or remove the resist layer 200 which remains intact over the formed openings during the process. Also it is preferable that the etchant used to etch the dielectric layer 115 does not etch the underlying silicon wafer 105. In other words, the silicon wafer 105 provides an etch-stop layer for the dielectric etchant thereby eliminating the possibility of over-etching.

The etching process (shown in FIG. 2D) results in cracks 230 forming in the plasticised regions 220 of the resist layer 200. These cracks allow the permeation of the aqueous etching solution to the underlying dielectric layer 115. After sufficient immersion time in the etchant solution, openings 250 are formed in the dielectric layer 115 to expose the underlying n-type silicon surface layer 110 only in those regions where the permeability of the resist layer 200 has been increased by the deposition of the plasticiser solution. In the preferred arrangement, the BOE solution 240 used to etch the dielectric layer does not etch the underlying n-type silicon surface 110; this n-type silicon surface layer provides an etch-stop layer for the applied etchant.

In general, the size of the formed opening in the dielectric layer 115 depends on the area of the plasticised region which is formed as a result of depositing a droplet on the resist layer 200. Deposition of smaller volume droplets will result in smaller plasticised regions and hence smaller openings on the dielectric layer. However, smaller droplet volumes result in less deposited plasticiser which, in general, necessitates the use of thinner resist layers. This is because there is insufficient deposited plasticiser to diffuse sufficiently far through the resist layer thickness in the direction of the underlying dielectric layer.

Figure 5:
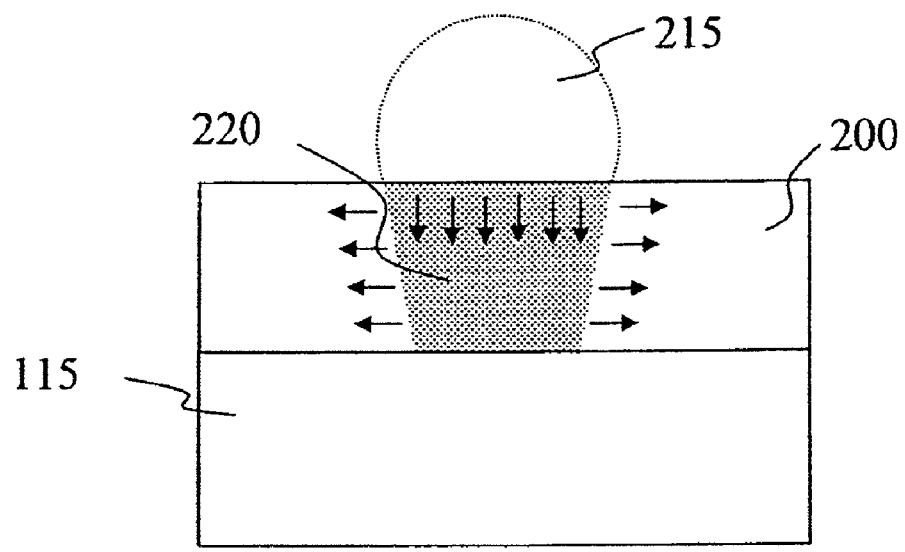
FIG. 5 is a schematic diagram that depicts the diffusion of plasticiser when deposited on a resist layer.

For a given droplet volume, the penetration depth of the plasticised region can be increased by increasing the kinetic energy of the deposited plasticiser molecules. This is most readily achieved by heating the substrate 100 during deposition. FIG. 5 depicts the mechanism in which the droplet 215 penetrates the resist layer 200 to create a permeable region 220. In the preferred arrangement, the substrate is heated to a temperature significantly above the room temperature but below a critical temperature where the resist layer hardens or changes its properties. Three identified mechanisms are in effect during this process. The first is the partial evaporation of the droplet due to the elevated temperature. The rate of evaporation of the droplet 215 depends on the vapour pressure of the plasticiser solution used. For the DEG droplet used in the preferred arrangement, this effect is expected to be minimal due to the low vapour pressure of DEG. The second is the diffusion of the droplet 215 into the resist layer 200 in the direction towards the underlying dielectric layer to create the permeable region 220 underneath the location of the drop. For the DEG droplet used in the preferred arrangement, this is expected to be the dominant effect. When the substrate is heated, additional kinetic energy transferred from the substrate to the molecules of the droplet allows the droplet to penetrate further into the resist layer. The third effect is the lateral diffusion of the droplet 215 sideways into the bulk of the resist layer 200. This causes dilution of the penetrating droplet into the bulk of the resist layer and lateral spreading of the permeable region.

Figure 4:
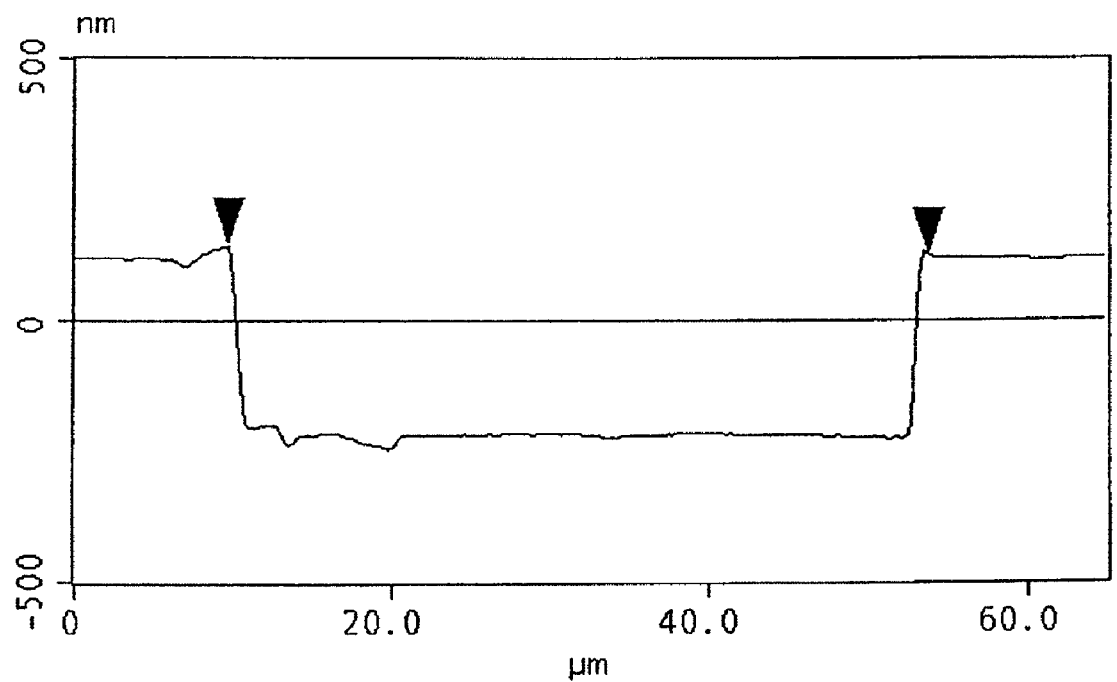
FIG. 4 is an AFM cross-section image of a circular opening (hole) formed in the dielectric layer of a semiconductor device.
Figure 6:
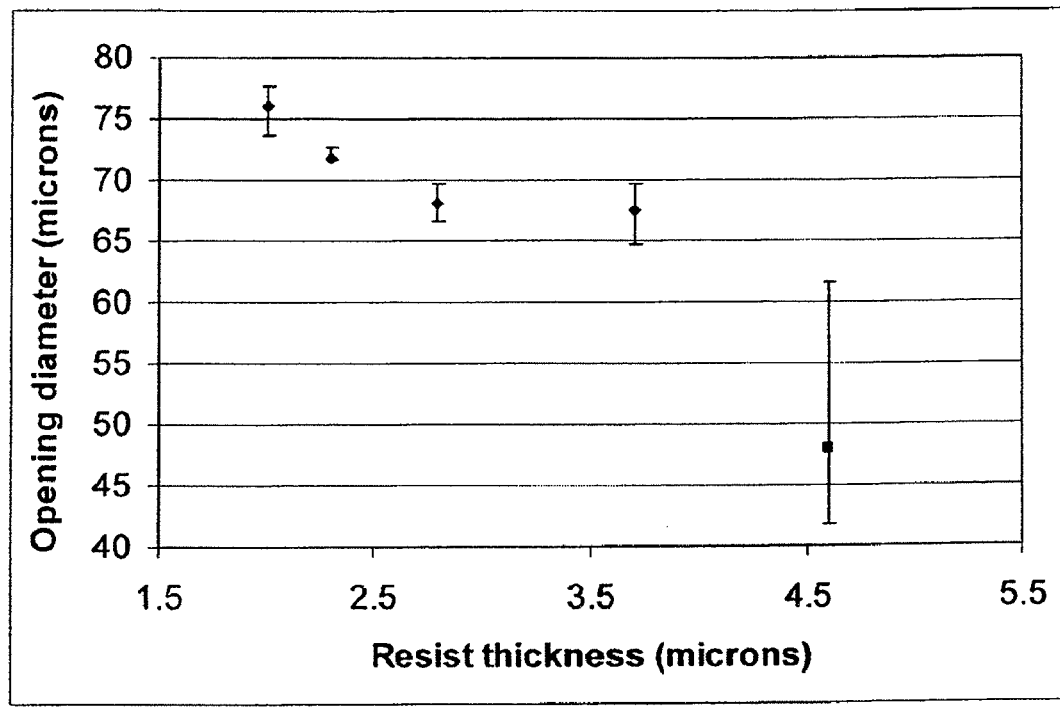
FIG. 6 is a graph showing the relationship between etched hole size and resist layer thickness for single 8 pL droplets of diethylene glycol plasticiser.
Figure 7:
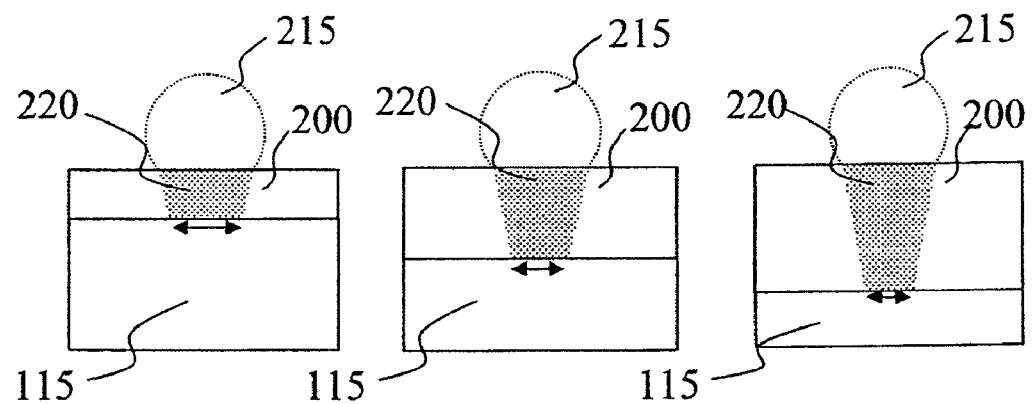
FIG. 7 is a schematic diagram which demonstrates how the size of an etched hole varies with the thickness of the resist layer.

The size of the opening on the dielectric layer for a particular droplet size can also be controlled through modifying the thickness of the resist layer 200. In the preferred arrangement, the diameter of circular-shaped openings on the dielectric layer formed by 8 pL plasticiser droplets can range from approximately 40 to 70 µm in diameter depending on the thickness of the resist layer 200. FIG. 4 is an AFM cross-section image of a 40 µm diameter hole which has been formed in a dielectric layer 115 using a resist thickness of 4.6 µm. The graph in FIG. 6 shows that the diameter of formed openings in a dielectric layer, using DEG as the plasticiser, decreases as the thickness of the resist layer is increased from 2.0 to 4.6 µm. The decreased size of the openings that results with increased resist layer thickness is believed to be due to a smaller effective interface area between the plasticised region 220 and the underlying dielectric layer 115 as shown in FIG. 7. However, as shown in FIG. 6, the variability of the size of the openings formed using a thicker resist layer is much greater. Consequently, thicker resist layers can be used to obtain smaller opening sizes when the larger variability of opening sizes is not critical for the application. The relationship between opening size and resist layer thickness must be calibrated for a given plasticiser, deposition volume, deposition conditions, and type of resist.

Once etching for a first set of openings has been completed, the resist layer's permeability to aqueous (etchant) solutions can be reversed. Preferably, the reversal is achieved by softening and reflowing the resist by exposing the resist to a saturated vapour of a solvent for the resist and then re-baking the substrate 100 to remove the extra solvent. Reversing the permeability allows the resist to protect the formed openings from the action of further etchants. So, in the case of the preferred arrangement, it is now desirable to form the openings for the p-type contacts 125. These contacts require openings to be formed in the dielectric layer with subsequent further etching of the underlying n-type silicon 110 to contact the p-type silicon wafer 105. It is desirable to perform this etching without affecting the already formed openings 250 for the n-type contacts 120.

Figure 3A:
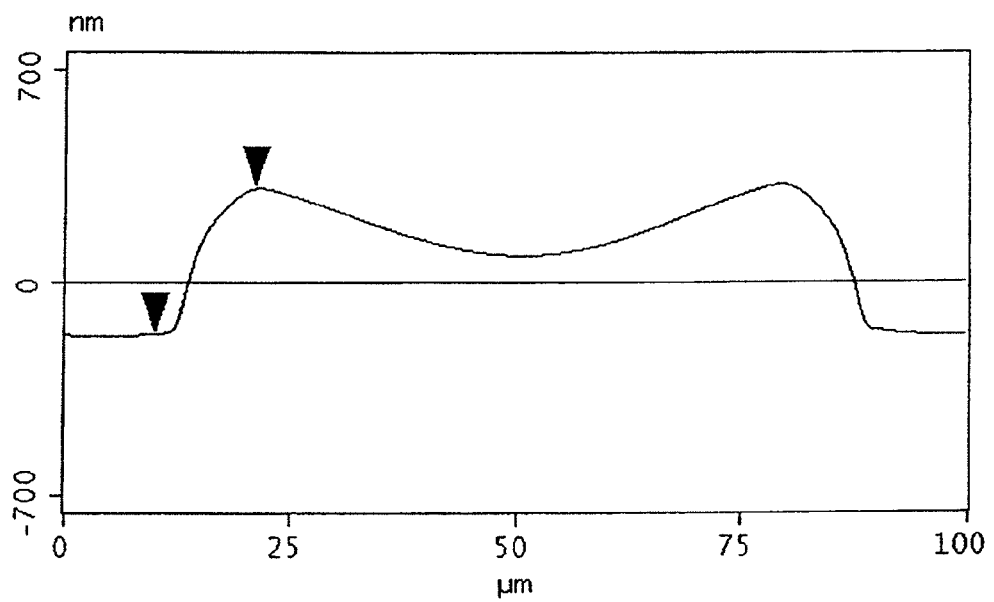
FIG. 3A shows an AFM cross-section image of a plasticised resist region formed as a result of depositing an 8 pL droplet of plasticiser solution on a resist layer.
Figure 3B:
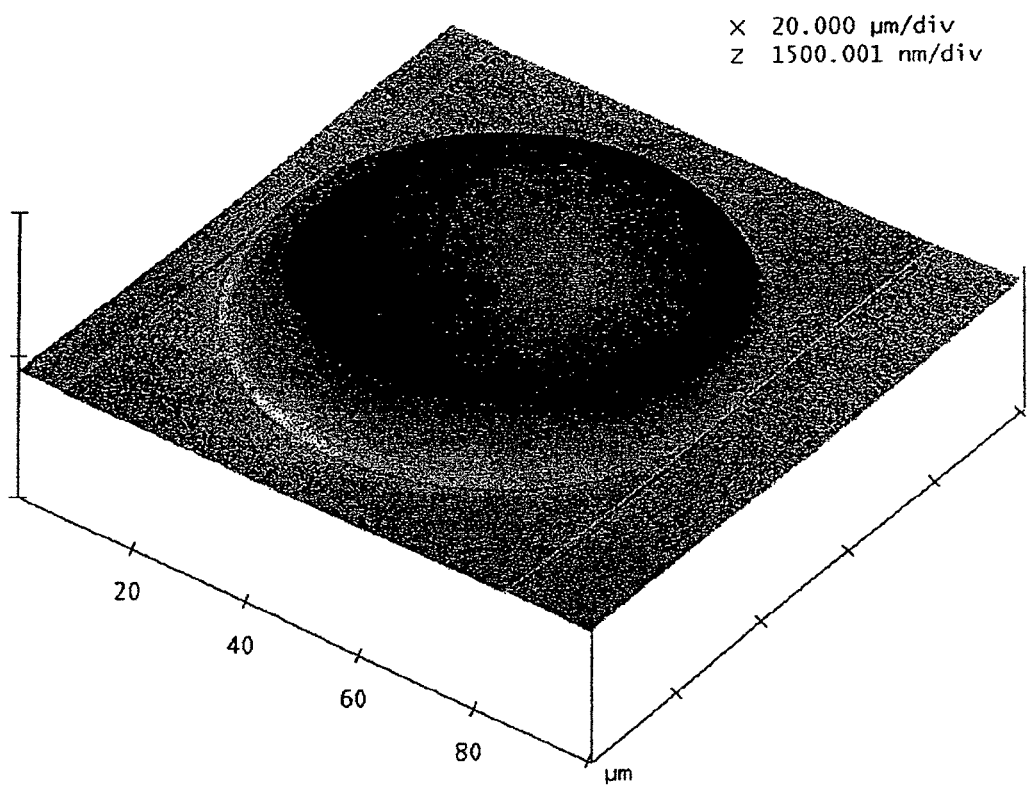
FIG. 3B shows an AFM image of the surface of a plasticised resist region formed as a result of depositing an 8 pL droplet of diethylene glycol plasticiser solution on a resist layer.

Preferably, the reflowing of the resist in the permeable regions is achieved by exposing the resist-covered substrate 100 to PGMEA vapour for at least 15 minutes for complete reversal of the permeability of regions, the size of which is similar to that of the regions depicted in FIG. 3A and FIG. 3B. The permeability of smaller permeable regions, formed for example by the deposition of smaller droplet volumes, can be reversed by shorter exposure times to the saturated vapour. In the preferred arrangement, the resist-covered substrate is baked at 140° C. for at 10 minutes after the reflow process in order to remove the additional solvent. Other baking conditions can also be used.

Regions of the substrate 100 can be covered during the resist reflow process and thus protected from resist reflow. In the preferred arrangement, a glass slide is placed over an alignment mark on the substrate 100 which was printed during the first patterning step shown in FIG. 2B. The glass slide prevents resist reflow in the area of the alignment mark so that the mark can be detected in the fiducial camera of the inkjet printer in subsequent printing steps and used to correctly align subsequent deposition patterns. In some cases it may be desirable to further etch the structures underlying a subset of the permeable regions. In these cases, the resist can be controlled to reflow over only the regions that require protection.

The resist's permeability can also be reversed by deposition of further resist material over the plasticised region on a heated platen. This method of reversing the permeability of the resist is preferred if large openings have been formed under the permeable regions. If the material used to form the resist layer 200 (by spin coating) is more viscous than that required for deposition by the drop-on-demand device, the material can be diluted using a solvent for the resist material. The solvent can be the same solvent used in the solution that was originally spin-coated on the substrate 100 (e.g., PGMEA for the Microposit FSM novolac resin). Alternatively, a more volatile solvent, such as acetone, can be used. The resist material can be deposited (droplets 260 in FIG. 2E) during the same printing process used to deposit plasticiser solution for a further set of openings (droplets 265 in FIG. 2E). In other words, a separate print process is not required to reverse the permeability of a set of plasticised regions of resist. Although, the heated platen does not drive all the solvent from the additional deposited resist material, it removes sufficient to effectively reverse the permeability of the plasticised regions 220 to aqueous solutions.

The permeability of the first set of plasticised regions can also be reversed by heating the resist layer 200 at a temperature of at least 190° C. for at least 30 mins. Other heating conditions may be appropriate for different resist/plasticiser combinations. During the heating process, the increased permeability of plasticised regions of the resist layer 200 to aqueous solutions is reversed due to:

(i) evaporation of water (which remains from the etching solution) from the resist;

(ii) lateral diffusion, and hence dilution, of the plasticiser within the resin;

(iii) evaporation of residual solvent from the resist; and (iv) evaporation of plasticiser from the resist; and (v) reflowing of resist.

Because plasticisers are typically non-volatile additives, the contribution of item (iv) is limited. Although, in the preferred arrangement, the novolac resist layer is baked after coating, some residual solvent typically remains. Further heating can remove some of this residual solvent making the layer more impermeable. As the resist layer 200 is heated the swelling is reduced in the plasticised region of resist 220 and cracks, resulting from the etching process, disappear.

The process of making a resist layer transiently more permeable to aqueous solutions is markedly different from that of creating an opening in a resist (or polymer) layer itself, such as by depositing one or more drops of solvent. It is also possible to form holes in a resist layer by depositing droplets of a caustic solution (dilute potassium hydroxide). In each of the abovementioned known prior art methods, holes or openings are formed in the resist or polymer layer. Once formed, these openings can not be reversed because polymer/resist material is either moved to the perimeter of the droplet region as the solvent evaporates or chemically modified by the reaction with the deposited material.

The creation of reversible permeable regions, rather than openings, in a resist layer, enables a first set of openings to be created in the underlying device and then protected by reversing the permeability of the above-lying resist. This means that the first set of openings is protected from the action of etchants that may be used to create further sets of openings in the device. Methods which form openings for contacts to both p and n-type regions in a thin film solar device, rely on the fact that the device is only exposed to the etchant for the second set of openings for a very short time. Therefore by carefully controlling the etching time, limited further etching of the silicon under the first set of openings results. However, because the first set of openings cannot be protected from the action of subsequently used etchants, the selection of etching methods is severely limited. Furthermore, it would be difficult to use such method in an application that required more than two sets of openings.

When reversing the permeability of the resist in an area, the reversal need not be complete. Controlling the reversal process, to achieve a partial reversal of the permeability, provides an excellent method of reducing the area made permeable and hence reducing the hole size made in the underlying selected material when etching through the permeable area.

A number of reversal methods can result in partial reversal (i.e. a reduction in the permeable areas) which in turn allows the etching of smaller holes. Some examples are:

a) applying carefully measured amounts of resist over the plasticised areas such that the plasticiser diffuses from the plasticised area into the newly deposited resist and causes reduced permeability particularly around the edges of the plasticised region;

b) applying a solvent for the resist which softens and reflows the resist in the plasticised regions increasing the mobility of the plasticiser and allowing diffusion of the plasticiser over a larger area resulting in a reduction of permeability particularly at the edges of the original plasticised areas c) heating the resist to cause softening of the resist which increases the mobility of the plasticiser in the plasticised regions and causes diffusion of the plasticiser over a larger area resulting in a reduction of permeability particularly at the edges of the original plasticised areas d) using a relatively volatile plasticiser to cause the permeable regions in the first place and heating the plasticised regions to drive out some of the plasticiser resulting in a reduction of permeability particularly at the edges of the original plasticised areas.

Selective heating of the plasticised regions may be achieved using a laser, which may be slightly defocused if necessary to allow less aggressive heating over a larger area.

When softening and reflowing the resist by exposure to a saturated vapour of a solvent for the resist, the time for which the resist is exposed to the solvent can be controlled to ensure only partial and not complete reversal of the resist's permeability. For example, if the reflow process is applied before the openings are etched in the dielectric, then the resist's permeability is reversed only at the edges of the permeable region, thus resulting in a smaller permeable region and a smaller etched opening after exposure to the etching solution. Partial reversibility can also be used to achieve etched structures having different dimensions in different device layers. For example, after openings have been formed in the dielectric, substantially as described with respect to FIG. 2D, the resist can be reflowed for a short time to reduce the diameter of the permeable region. The substrate 100 can then be immersed in a solution which can etch the silicon material under the dielectric. This process results in a structure having a smaller diameter opening in the silicon under the larger opening in the dielectric layer. When applying resist to the surface to be etched, the thickness of the resist may be varied so that the thinner regions will become permeable to the etching solution prior to the thicker regions after application of a given amount of the plasticiser solution. This will also provide additional ways of making the feature sizes (permeable areas) smaller than can be achieved by using the standard droplet size. Because the plasticised region diminishes in area with depth in the resin layer the thicker the resin layer the smaller the area of the plasticised region will be at the surface of the selected material to be etched.

There is a range of ways in which the thickness in the resist layer can be varied. For example, when the resin layers are deposited on textured surfaces, thinner regions are formed near the peaks of the pyramids or grooves where the <111> planes intersect. Alternatively, the resin can be deposited with non uniform thickness by various techniques including the use of inkjet printing or screen-printing of the resin material. Subsequent deposition of the first solution in target locations can therefore produce permeable regions of reduced area compared to the droplet size by virtue of the fact that some of the area under each droplet has resist that is thicker.

Returning now to FIG. 2E, the process for forming openings for the p-type contacts 125 will now be described. Droplets of resist solution 260 are deposited by a print head 210 of the inkjet device 205 at the location of the previously plasticised regions 220. In the same printing process, droplets of plasticiser 265 are deposited at the locations of the required p-type openings. As described previously for the n-type openings, the platen is preferably heated to at least 60° C. and preferably 70° C. to facilitate diffusion of the plasticiser in the resist and evaporation of solvent from the deposited resist solution.

In order to position the droplets 260 and 265 in the correct position with respect to the first set of droplets 215, it is necessary to align the substrate 100 correctly on the platen of the inkjet system 205. Preferably, this is achieved using an optical substrate alignment/registration system which involves the printing of an alignment mark during the first printing process. In a subsequent printing process, the printed alignment mark is optically detected, and the substrate is aligned for printing according to the detected mark. Other methods of re-aligning the substrate 100 for subsequent printing processes can also be used.

Figure 8:
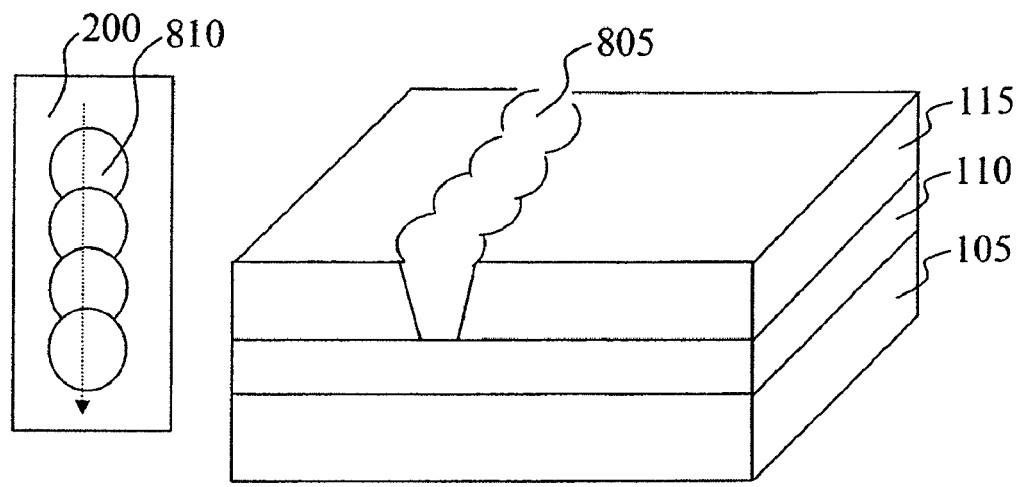
FIG. 8 is a schematic diagram which shows how a groove can be formed by the deposition of a line of droplets of plasticiser.

As shown in FIG. 1A, the structure of the p-type contact 125 in the solar cell device 100 is a continuous groove that follows a pre-determined pattern. The preferred method for forming the grooves is shown schematically in FIG. 8. The continuous opening on the dielectric layer 115 is achieved by depositing overlapping droplets 810 onto the resist layer 200. These droplets create a linear permeable region which when exposed to an appropriate etchant form a groove 805 in the dielectric layer 115. The degree of overlapping between each deposited droplet determines the straightness of the edge of the openings on the dielectric layer. In general, the more overlap between droplets, the straighter the edge of the dielectric layer opening. However, too much overlap between the deposited droplets may result in wider openings on the dielectric layer 115. In the preferred arrangement, the distance between individual 8 pL deposited droplets of DEG is 73 μm resulting in an overlap of approximately 7 μm between adjacent deposited droplets.

Figure 2D:
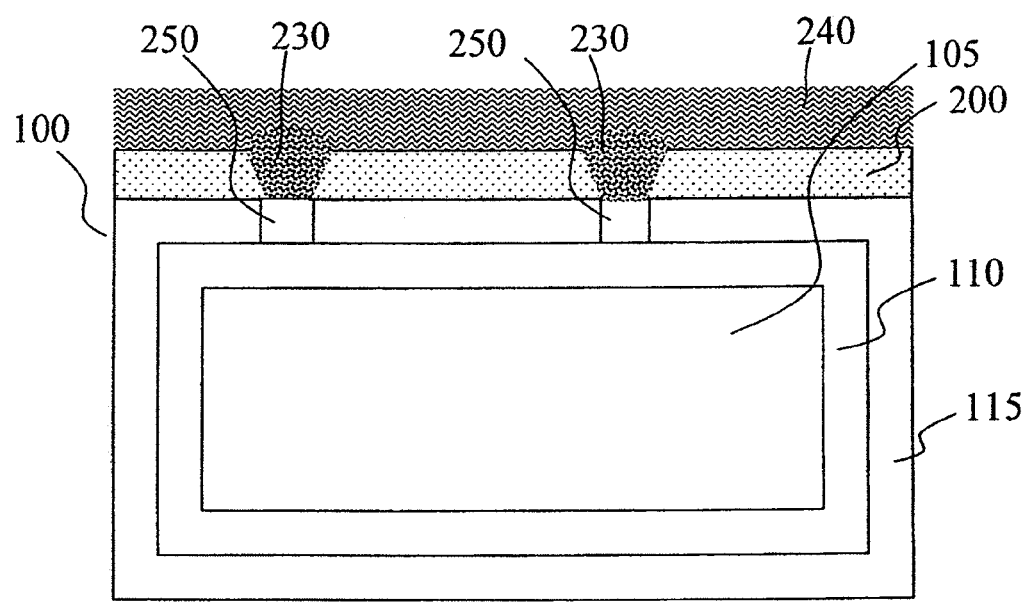
FIG. 2D is a schematic diagram showing the creation of openings in the dielectric layer that expose n-type silicon under the plasticised regions shown in FIG. 2C.
Figure 2E:
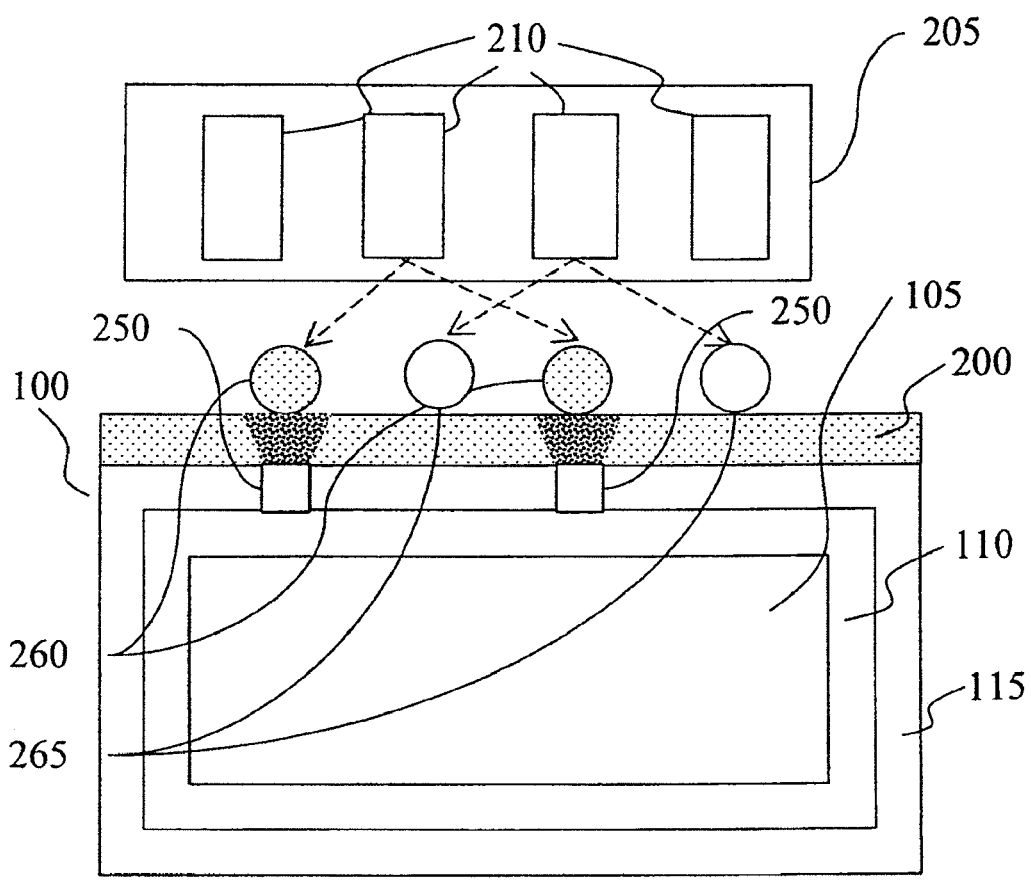
FIG. 2E is a schematic diagram showing the deposition of further resist over the plasticised regions depicted in FIGS. 2C and 2D and the deposition of plasticiser at locations for a second set of openings.
Figure 2F:
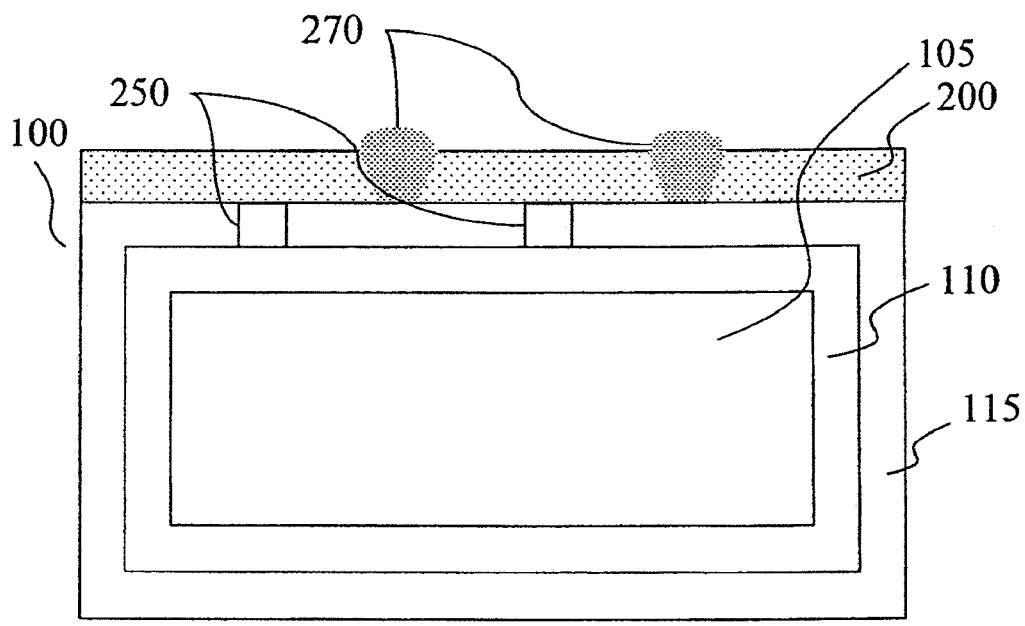
FIG. 2F is a schematic diagram showing the formation of plasticised regions at locations for a second set of openings.
Figure 2G:
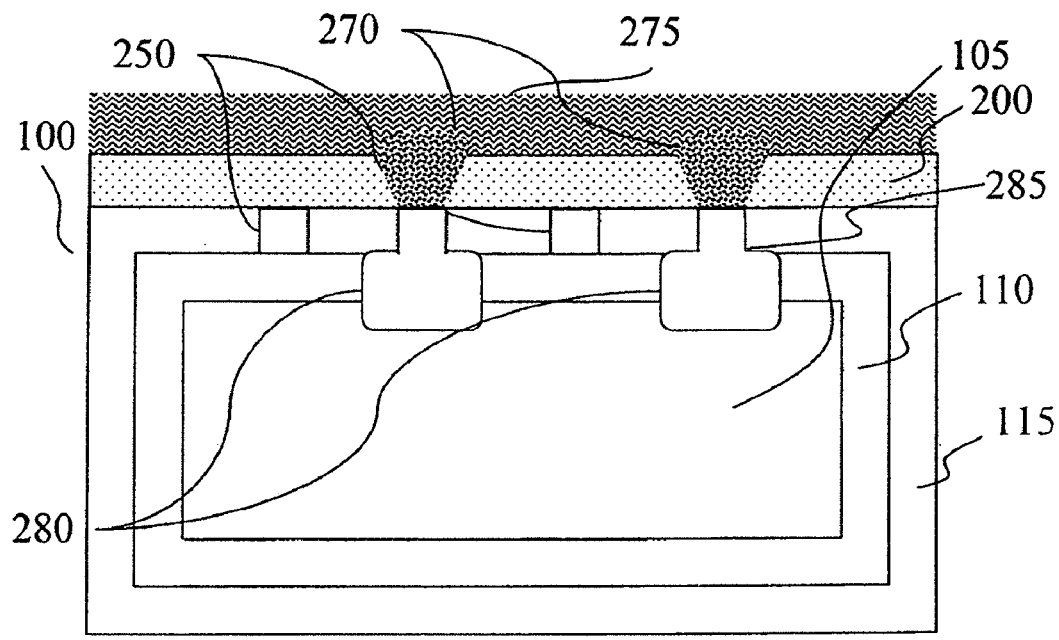
FIG. 2G is a schematic diagram showing for the formation of openings that expose the p-type silicon under the plasticised regions depicted in FIG. 2F.

The groove openings through the underlying dielectric layer 115 can be formed substantially as described with respect to FIG. 2D for the plasticised regions 270 formed and shown in FIG. 2F. In order to etch through the n-type silicon layer to expose the p-type material an appropriate silicon etchant is used. FIG. 2G shows the substrate 100 immersed in a tank of etchant 275 that is suitable for etching the now exposed n-type silicon surface layer 110. Preferably, the etching process does not remove the resist layer 200 and it remains intact over the entire surface during the process.

In the preferred arrangement, the etching of the n-type silicon is achieved by immersing the substrate 100 in a tank of HNA etch (a mixture of hydrofluoric acid, nitric acid and water/acetic acid) for 1 minute. The substrate 100 is then rinsed in $H_2O$ for 10 minutes to remove all traces of the etchant from the device. HNA etch is a well-known isotropic etch for silicon, which etches the silicon at the same rate in all directions. An isotropic etch is used to form an overhanging dielectric layer structure 285. This structure acts as a shadow mask when metal is subsequently deposited. It prevents the metal from being deposited where it could short the n-type and p-type silicon.

Figure 2H:
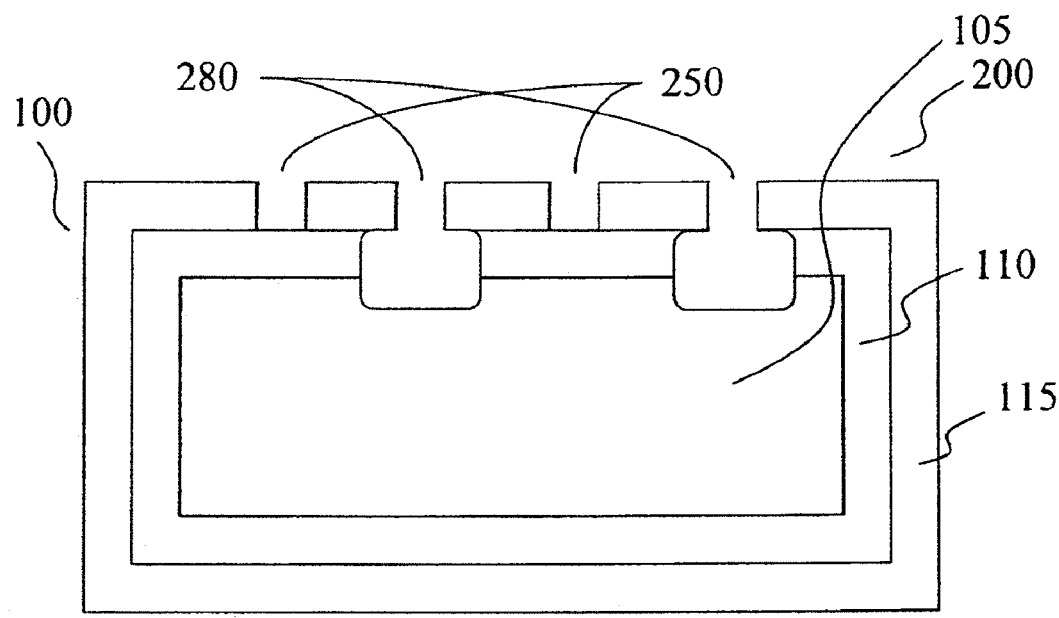
FIG. 2H is a schematic diagram showing the device and the formed openings after the resist layer has been removed.
Figure 9:
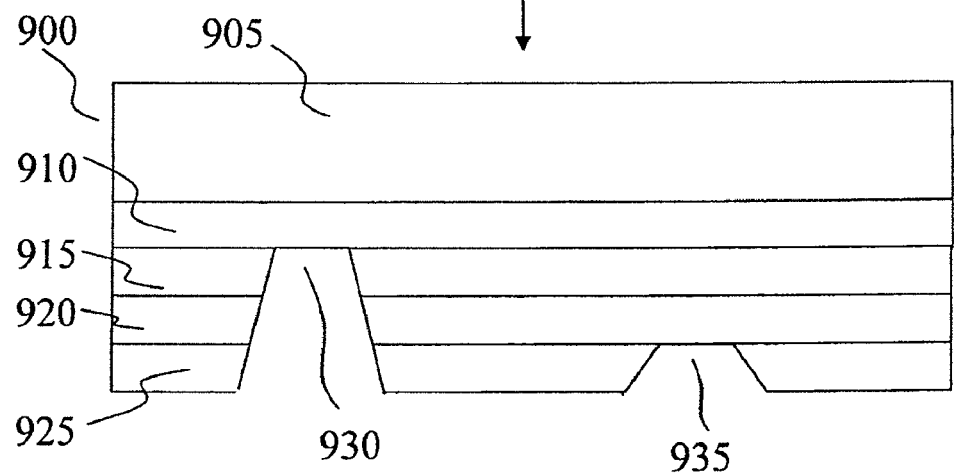
FIG. 9 is a schematic diagram of an alternative thin film solar cell device arrangement made by a process incorporating the methods described herein.

In the preferred arrangement, only two sets of openings are required in the device structure as shown in FIG. 1B. However, in other applications of this method, further sets of openings may also be patterned using the same resist layer 200. Once the patterning process is completed, the resist layer 200 may be removed (as shown in FIG. 2H) or retained as part of the device structure. An example where it is advantageous to retain the resist layer is in the fabrication of polycrystalline thin-film solar cells 900 as shown in FIG. 9 consisting of glass substrate 905 with deposited silicon layers of polarities $n^+$ layer 910, p layer 915 and $p^+$ layer 920. The resist layer 925 can be loaded with 20-30% titanium dioxide pigments which act as a rear surface reflection layer to reflect light back into the device. The silicon layers may be deposited using e-beam evaporator, ion-assisted deposition or plasma-enhanced chemical vapour deposition and may consist of other polarity structures such as $p^+nn^+$. The method described herein can be used to form the openings 930 and 935 which are necessary to form the n-type and p-type contact for the device, respectively. Because the resist layer is being retained as part of the device 900, it is necessary that the openings 930 and 935 are also formed in the resist layer 925 before the metal for the contacts can be deposited. This reopening of the resist layer can be achieved by inkjet deposition of droplets of solvent, or by inkjet deposition of caustic solution. Once the openings have been made in the resist layer 925 they cannot be reversed.

Alternatively, openings can be formed in the resist layer 200 by depositing a larger volume of plasticiser than that required to make the region permeable. In this case, the plasticiser behaves like a solvent for the resist and holes form in the resist layer. Larger volumes of plasticiser can be deposited by using a drop-on-demand device to deposit a controlled number of fixed volume droplets at the same location. Alternatively, devices allowing a variable droplet size can be used to deposit the required amount of plasticiser.

Now returning to FIG. 2H, in the preferred arrangement the resist layer 200 is removed to create the structure shown in FIG. 1B. The resist layer 200 is removed by immersing the substrate 100 in a tank of piranha etch solution, which consists of a mixture between sulphuric acid and hydrogen peroxide, for at least 5 minutes and then rinsing the device in a tank of $H_2O$ for 10 minutes to remove any traces of the etching solution from the device. This etch removes organic material, such as novolac resin, such that no residue of the resist layer 200 remains on the surface of the solar cell device 100. Other suitable resist layer removal solutions may also be used for the particular resist layer used in other applications. Once the resist layer is removed, a pattern in the dielectric layer 115 emerges according to the pre-determined pattern without the need for costly photomasks, photoresist and potentially eliminates repetitive lithographic steps and alignments.

Figure 2I:
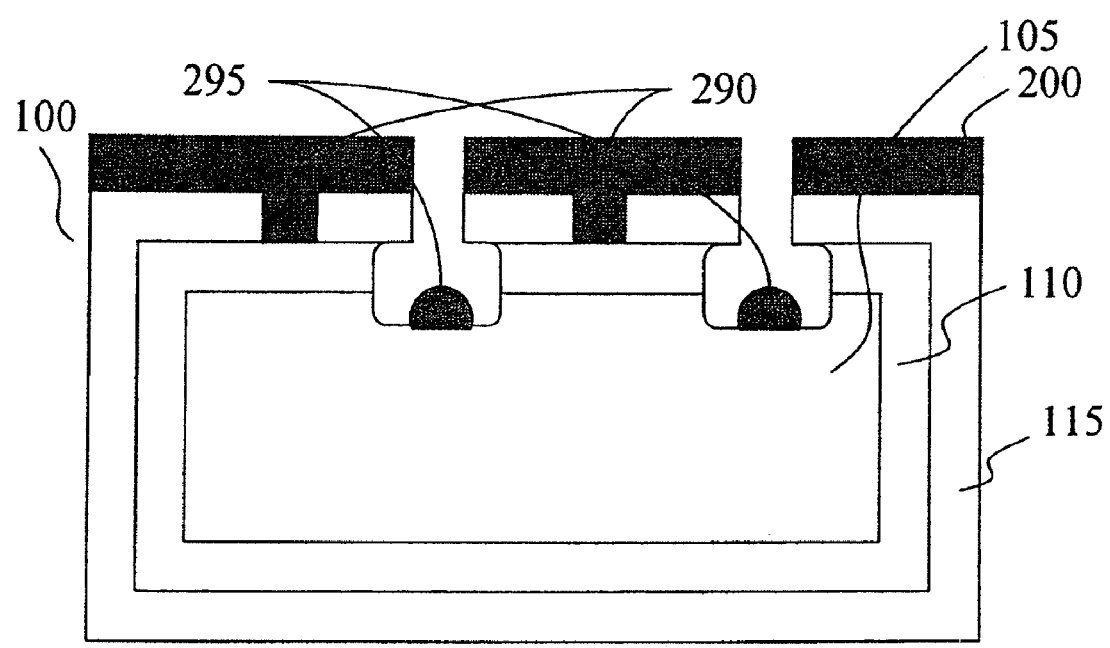
FIG. 2I is a schematic diagram showing the device after metal has been deposited in the two openings to create an n-type and p-type contact for a solar cell device.

In the preferred arrangement, the openings in the dielectric layers 250 and 280 are now created which allows the deposition of metal to form the n-type and p-type contacts, respectively. A suitable metal, such as aluminium, is deposited onto the patterned surface of the solar cell device 100 by thermal evaporation or sputtering or some other appropriate deposition method to create the finished device structure as shown in FIG. 2I. Metal contacts can also be formed by drop-on-demand deposition of a metal nanoparticle solution at the necessary locations. The nanoparticles can then be cured to result in conductive metal contacts.

Figure 10:
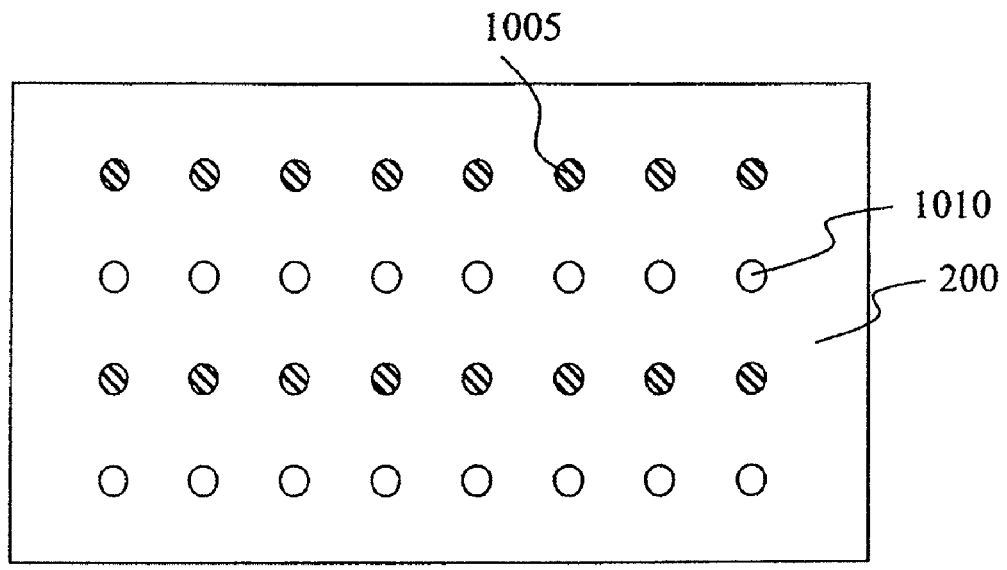
FIG. 10 is a schematic diagram of the resist layer (from above) showing two sets of plasticised resist regions resulting from the printing of two different plasticiser solution compositions.

In an alternative processing arrangement, different plasticiser solutions that require different etching process can be deposited in the same inkjet deposition process. In this case, a first set of openings can be created in regions plasticised using a first plasticiser solution while leaving regions plasticised using a second plasticiser solution substantially unaffected. This arrangement has the advantage over the method described with respect to FIG. 2A to FIG. 2I, in that it is not necessary to re-align the substrate 100 for subsequent printing processes after a first set of openings has been formed. A typical pattern (image) that can be printed on the resist layer 200 according to this variation is shown in FIG. 10. The pattern in FIG. 10 contains a first and second set of plasticised regions of resist layer, 1005 and 1010, respectively. Set 1005 are formed by depositing droplets of a first plasticiser solution, and a set 1010 are formed by depositing droplets of a second plasticiser solution.

As described above with respect to FIG. 2D, application of a plasticiser solution can make regions of resist layer more permeable to subsequently applied aqueous etching solutions. However, if the deposited plasticiser solution does not contain a sufficient proportion of water, it is necessary to first immerse the solar cell device 100 in a tank of $H_2O$ before immersing it in the required etching solution. This step is required in order to create a sufficiently aqueous environment for the etchant to permeate through the plasticised regions. The need for the $H_2O$ immersion step can be removed by adding a sufficient proportion of $H_2O$ to the deposited plasticiser solution. In the case of the preferred arrangement, where DEG is used as the plasticiser, if a second plasticiser solution comprising 50% (v/v) DEG in $H_2O$ mixture is deposited on the resist layer 200, the $H_2O$ immersion step is no longer necessary. Consequently, a pattern such as shown in FIG. 10 can be formed on a resist layer 200 using 100% DEG and 50% DEG diluted in $H_2O$ as the first and second plasticising solutions, respectively. The set of plasticised regions 1005 resulting from the 50% DEG and 50% $H_2O$ mixture can be immediately etched without affecting the set 1010. The solar cell device 100 can then be rinsed in $H_2O$, which serves to rinse the etching solution from the first set of plasticised regions and activate the second set of plasticised regions 1010. The second set of plasticised regions 1010 can then be etched as required.

Although the method of exploiting different processing methods for different plasticising solutions, as described above with respect to FIG. 10, does not require re-alignment of the substrate, it does not allow the first set of openings to be protected (by reversing the permeability) whilst a second set of openings is being created. This means that an appropriate etching solution or device structural design must be carefully formulated in order to take advantage of this particular arrangement. The solar cell device 10 as shown in FIG. 1B can also be fabricated using the method just described by first forming the p-type openings (with the first set of plasticised regions 1005) and then carefully controlling the etching time used for the n-type openings (which are defined using the second set of plasticised regions 1010).

Figure 11:
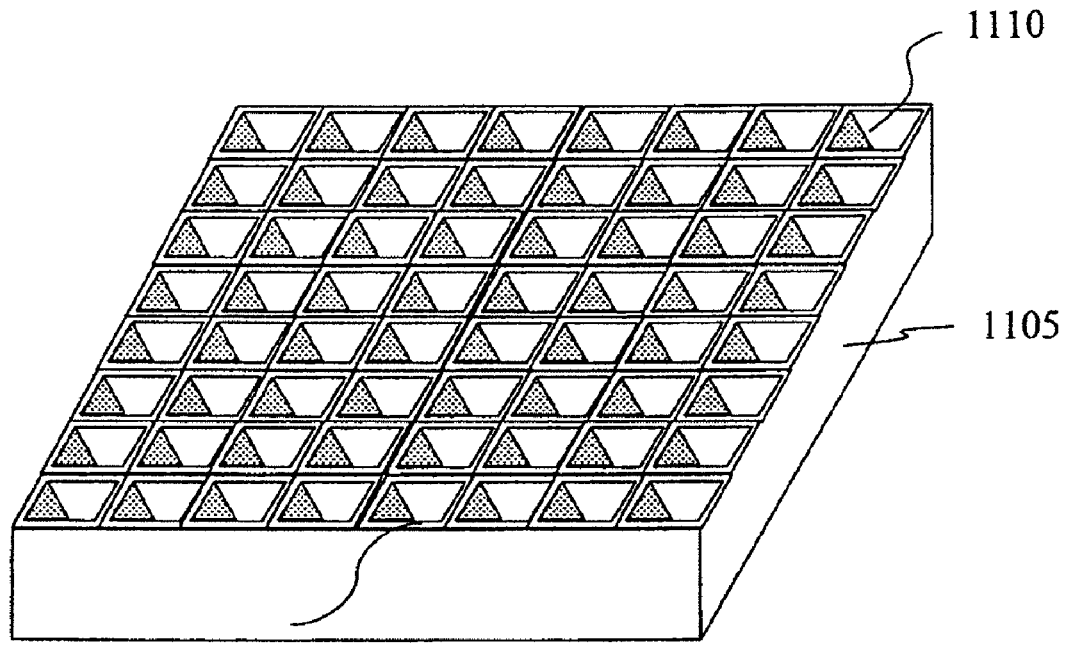
FIG. 11 is a schematic diagram showing a textured silicon wafer substrate.

In a further variation of the preferred arrangement shown in FIG. 1B, and utilised in the solar cell device 10, the surface of the silicon wafer substrate 1105 can be textured as to form inverted pyramids, such as 1110, as shown in FIG. 11. An inverted pyramid structure is used on the front surface of any solar cell device to increase trapping of incoming light into the device, which results in higher generated electrical current from the device. The surface of crystalline silicon 1105 of crystallographic orientation <100> can be chemically textured using a wet anisotropic etch. This results in a surface comprising randomly distributed upright square based pyramids 1110. Surface texturing can also be achieved with the use of mechanical, electrochemical or laser means. The textured silicon wafer can be either p-type or n-type and can then be processed as described previously with reference to FIG. 1 and FIG. 2.

A potentially important use for the solar cell structures, such as the solar cell 10, is to facilitate solar cell manufacturing in places like developing countries where cleanliness is poor and technical expertise is often lacking. Solar cell manufacturers in developing countries can purchase silicon wafers, substantially in the form shown in FIG. 2A (i.e., already textured, doped and oxidised but without the resist layer 200). Use of the abovementioned method of forming contacts, means that no further high temperature processes are required (i.e., nothing above 300° C.) and therefore there is little likelihood of destroying the potential for high minority carrier lifetimes and good quality surface passivation which can be achieved in the structure shown in FIG. 1. Furthermore, by using the above described inkjet-based method of forming openings, contacts of both polarities can be formed without the use of sophisticated equipment that requires significant technical expertise for its operation and maintenance. Consequently, it becomes feasible in regions such as developing countries to complete the remaining processing that requires relatively low cost and unsophisticated equipment that is typical of equipment already found in such developing countries. This is not possible with commercial solar cell technologies, currently in use around the world (e.g., screen printed solar cell devices), which require high temperature diffusions and oxidations and high temperature metal sintering.

The method of forming openings in underlying structures can also be used in other solar cell device arrangements. For example, different contact structures employing different patterns of holes and grooves can be formed. The method can also be used for devices other than silicon-wafer based solar cell devices. For example, the method could be generally used for semiconductor devices such as inkjet-printed transistors as used for active matrix display devices and patterned anodes/cathodes of LCD or LED displays.

The method can also be used to form openings in MEMS devices. For example, it could be used to form openings such as nozzle chambers of inkjet devices. In this case, the ability to reverse the permeability of the resist layer to form a resin barrier over the opening is advantageous. For example, many current inkjet nozzle structures employ a cross-linked or epoxy resin layer as the roof of the nozzle chamber. The current method allows the opening to be etched with the resin layer in place.

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

What is claimed is:

1. A method of forming one or more openings in a layer of a selected material, the method comprising:
   (a) forming a polymer resist layer over said selected material;
   (b) depositing a first solution onto the surface of said polymer resist layer at a first set of one or more target locations, said first solution selected to increase permeability of the polymer resist layer through its entire thickness to a second solution, in an area which has had the first solution applied, and the second solution being an etchant or solvent for the selected material;
   (c) contacting said polymer resist layer with said second solution, whereby the second solution permeates the polymer resist layer through its entire thickness in the area of increased permeability and forms an opening in the selected material beneath the area of increased permeability.

2. The method of claim 1 wherein the selected material is a surface layer of a semiconductor structure.

3. The method of claim 2 wherein the semiconductor structure is a precursor to a solar cell device.

4. The method as claimed in claim 3 in which, after the openings are formed in the selected layer, an opening is formed in a layer underlying the layer of selected material by a separate etch.

5. The method as claimed in claim 4 in which, the layer underlying the layer of selected material is a semiconductor material and the layer of selected material is a layer of a dielectric material.

6. The method as claimed in claim 5 in which the layer of selected material is a layer of a dielectric material compound of the semiconductor material.

7. The method as claimed in claim 1 in which, after the first solution is applied, the change in permeability in the polymer resist layer is at least partially reversed.

8. The method as claimed in claim 7 in which the partial reversal of the permeability causes a reduction of the area made permeable and a resultant reduction in the opening size made in the underlying selected material when etching through the permeable area.

9. The method as claimed in claim 7 in which the reversal is achieved by applying polymer resist over the permeable areas causing reduced permeability of the permeable region.

10. The method as claimed in claim 7 in which a solvent for the polymer resist is applied to the polymer resist layer to soften the polymer resist in the permeable regions resulting in a reduction of permeability of the permeable areas.

11. The method as claimed in claim 10 where the solvent is applied as a vapour that softens the polymer resist and causes it to reflow over the permeable regions.

12. The method as claimed in claim 11 where the polymer resist layer is heated, after being exposed to the solvent vapour, in order to remove excess solvent from the polymer resist.

13. The method as claimed in claim 12 in which selective heating of the permeable regions is performed using a laser.

14. The method as claimed in claim 13 in which the thickness of the polymer resist layer applied to the surface of the selected material is varied so that the thinner regions will become permeable to the etching solution prior to the thicker regions after application of a given amount of the first solution.

15. The method as claimed in claim 14 in which the thickness in the polymer resist layer is varied by depositing the resin layers on textured surfaces, whereby thinner regions are formed near peaks of pyramids or grooves where <111> planes intersect.

16. The method as claimed in claim 14 in which the resin is deposited with nonuniform thickness by inkjet printing of the resin material.

17. The method as claimed in claim 14 in which the resin is deposited with nonuniform thickness by screen-printing of the resin material.

18. The method as claimed in claim 14 in which deposition of the first solution in target locations produces permeable regions of differing area, compared to the droplet size, by virtue of the fact that the thickness of the polymer resist layer under the droplets varies from droplet to droplet.

19. The method as claimed in claim 18 in which, after the openings are formed, the change in permeability in the polymer resist layer is reversed to protect the openings from further processing.

20. The method as claimed in claim 1 in which at least two sets of openings are formed in the layer of selected material, the method further comprising:
(a) selectively depositing a third solution which is different from the first solution at a second set of one or more target locations, said third solution selected to increase permeability of the polymer resist layer through its entire thickness to a fourth solution, in an area which has had the third solution applied, and the fourth solution being an etchant or solvent for the selected material;
(b) contacting said polymer resist layer with the fourth solution, whereby the said fourth solution permeates the polymer resist layer through its entire thickness in the area of increased permeability of the fourth solution and forms openings in the selected material beneath the area of increased permeability of the fourth solution.

* * * * *